(12) United States Patent
Creigh et al.

(10) Patent No.: US 6,731,914 B2
(45) Date of Patent: May 4, 2004

(54) DETERMINATION OF TRANSMITTER DISTORTION

(75) Inventors: John L. Creigh, Rancho Santa Margarita, CA (US); Oscar E. Agazzi, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 452 days.

(21) Appl. No.: 09/792,763

(22) Filed: Feb. 22, 2001

(65) Prior Publication Data

US 2001/0034216 A1 Oct. 25, 2001

Related U.S. Application Data

(60) Provisional application No. 60/130,616, filed on Apr. 22, 1999, provisional application No. 60/108,319, filed on Nov. 13, 1998, and provisional application No. 60/106,870, filed on Nov. 2, 1998.

(51) Int. Cl.[7] ................................................. H03C 1/62
(52) U.S. Cl. ................. 455/115.1; 455/501; 455/115.2; 375/278; 375/285; 375/296
(58) Field of Search ................................ 455/115.1, 91, 455/501, 115.2, 67.11, 67.14, 63.1, 126, 114.2; 375/278, 285, 295, 296, 284, 297, 146; 324/314

(56) References Cited

U.S. PATENT DOCUMENTS

| | | | |
|---|---|---|---|
| 4,615,038 A | | 9/1986 | Lim et al. .................. 375/14 |
| 4,792,915 A | | 12/1988 | Adams et al. ......... 364/724.19 |
| 5,247,458 A | | 9/1993 | Cabot ....................... 364/550 |
| 5,339,054 A | * | 8/1994 | Taguchi .................... 332/100 |
| 5,761,239 A | * | 6/1998 | Gold et al. ................ 375/150 |
| 5,790,591 A | * | 8/1998 | Gold et al. ................ 375/142 |
| 6,034,993 A | * | 3/2000 | Norrell et al. ............. 375/232 |
| 6,075,634 A | * | 6/2000 | Casper et al. ............. 398/139 |
| 6,081,158 A | * | 6/2000 | Twitchell et al. .......... 330/149 |
| 6,185,261 B1 | * | 2/2001 | Creigh et al. ............. 375/285 |
| 6,252,904 B1 | * | 6/2001 | Agazzi et al. ............. 375/233 |
| 6,252,912 B1 | * | 6/2001 | Salinger ................... 375/278 |
| 6,459,746 B2 | * | 10/2002 | Agazzi et al. ............. 375/371 |

FOREIGN PATENT DOCUMENTS

EP 0 399 968 A1 11/1990

OTHER PUBLICATIONS

IEEE, "Supplement to Carrier Sense Multiple Access With Collision Detection (CSMA/CD) Access Method and Physical Layer Specifications—Physical Layer Parameters and Specifications for 1000 Mb/s Operation Over 4–Pair of Category 5 Balanced Copper Cabling, Type 1000BASE–T," Information Technology—Telecommunications and Information Exchange Between Systems—Local and Metropolitan Area Networks—Specific Requirements–; 1999; 140 pages; IEEE Std 802.3ab (Supplement to IEEE Std 802.3 1998 Edition); IEEE, NY.

K. Fischer, "Modeling Thin–Film Storage Channels," IEEE Transactions on Magnetics; Sep. 1989; pp. 4081–4083;vol. 25, No. 5, XP002133753 Section 2.1 Nonlinear Distortion.

Bellanger M.B., "Gradient Adaptive Filters," The Gradient—LMS Algorithm, 1987, pp. 97–98, XP02133754, 4.1, Marcel Dekker, US, New York.

* cited by examiner

*Primary Examiner*—Sonny Trinh
(74) *Attorney, Agent, or Firm*—McAndrews, Held & Malloy, Ltd.

(57) ABSTRACT

The present invention provides a method for determining nonlinear distortion of a transmitter. A test symbol sequence is transmitted from the transmitter under test as an analog output signal. The analog output signal is sampled to produce a first sequence which represents the test symbol sequence as distorted by a linear distortion sequence and a nonlinear distortion sequence. The test symbol sequence is filtered via an adaptive filter to produce a second sequence such that the second sequence is approximately equal to the test symbol sequence as distorted by the linear distortion sequence. The second sequence is subtracted from the first sequence to produce an output sequence substantially equal to the nonlinear distortion sequence.

2 Claims, 7 Drawing Sheets

DETERMINATION OF TRANSMITTER DISTORTION

CROSS-REFERENCE TO RELATED APPLICATIONS

The present invention claims priority on the basis of the following provisional applications, the contents of each of which are herein incorporated by reference: Ser. No. 60/106,870 entitled "Transmitter Test for Distortion" filed on Nov. 2, 1998; Ser. No. 60/108,319 entitled "Gigabit Ethernet Transceiver" filed on Nov. 13, 1998 and Ser. No. 60/130,616 entitled "Multi-Pair Gigabit Ethernet Transceiver" filed on Apr. 22, 1999.

BACKGROUND OF THE INVENTION

1. Field of the Invention

The present invention generally relates to distortion in transmitters. More particularly, the present invention relates to a method and a system for determining the nonlinear distortion of a transmitter included in a gigabit Ethernet transceiver.

2. Description of Related Art

Receivers that use digital signal processing modules, such as linear equalizers and cancellers, are particularly sensitive to nonlinear distortion that are present in the received signals. Severe nonlinear distortion would cause erroneous decoding of the received signals. The major contributor to the nonlinear distortion in a transmission channel is the corresponding transmitter.

In a Gigabit Ethernet communication system that conforms to the 1000BASE-T standard, two gigabit transceivers are connected via four twisted pairs of Category 5 copper cables and are in full-duplex bi-directional communication with each other. There are four constituent transceivers in each gigabit transceiver. The full-duplex bi-directional communication implies that each constituent transceiver is transmitting simultaneously on the same twisted pair of cable with a corresponding remote constituent transceiver. This simultaneous transmission would stress the analog components of the transmitter of a constituent transceiver. This stress would cause the transmitter to produce more nonlinear distortion. Thus, nonlinear distortion is an important problem in Gigabit Ethernet communication system.

In addition, the bi-directional nature of the Gigabit Ethernet communication system requires the use of echo cancellers in the gigabit transceivers. Since the echo cancellers are very sensitive to nonlinear distortion, nonlinear distortion must be kept, by design of the transmitters, at an acceptable level. The 1000BASE-T standard specifies that the peak nonlinear distortion of each constituent transceiver, when under test with no intervening cable, must be less than 10 millivolts.

Therefore, there is a need for techniques for determining nonlinear distortion of a transmitter, particularly, for a transmitter included in a constituent transceiver of a gigabit Ethernet transceiver.

SUMMARY OF THE INVENTION

The present invention provides a method for determining nonlinear distortion of a transmitter. A test symbol sequence is transmitted from the transmitter under test as an analog output signal. The analog output signal is sampled to produce a first sequence which represents the test symbol sequence as distorted by a linear distortion sequence and a nonlinear distortion sequence. The test symbol sequence is filtered via an adaptive filter to produce a second sequence such that the second sequence is approximately equal to the test symbol sequence as distorted by the linear distortion sequence. The second sequence is subtracted from the first sequence to produce an output sequence substantially equal to the nonlinear distortion sequence.

One embodiment of the invention provides a method for determining nonlinear distortion of a transmitter in the presence of a disturbing sinusoidal signal which simulates a signal transmitted from a remote transceiver in full duplex communication with the transceiver having the transmitter under test. A test symbol sequence is transmitted from the transmitter under test as an analog output signal. The analog output signal is sampled to produce a set of sampled data. A sinusoidal sequence is fitted to the sampled data. The sinusoidal sequence is subtracted from the sampled data to produce a first sequence, the first sequence representing the test symbol sequence as distorted by a linear distortion sequence and a nonlinear distortion sequence. The test symbol sequence is filtered via an adaptive filter to produce a second sequence such that the second sequence is approximately equal to the test symbol sequence as distorted by the linear distortion sequence. The filter coefficients are adapted based on the difference between the first and second sequences. The second sequence is subtracted from the first sequence to produce an output sequence substantially equal to the nonlinear distortion sequence.

BRIEF DESCRIPTION OF THE DRAWINGS

The features of the present invention will become more apparent and the invention will be best understood by reference to the following description and the accompanying drawings, wherein.

DETAILED DESCRIPTION OF THE INVENTION

The present invention provides a method for determining nonlinear distortion of a transmitter. A test symbol sequence is transmitted from the transmitter under test as an analog output signal. The analog output signal is sampled to produce a digital output signal which represents the test symbol sequence distorted by a linear distortion sequence and by a nonlinear distortion sequence. The echo cancellation technique is used to approximately remove the test symbol sequence and the linear distortion sequence. The residual sequence is then a measure of the nonlinear distortion of the transmitter under test.

The present invention can be used to measure the nonlinear distortion of a transmitter in a gigabit transceiver of a Gigabit Ethernet communication system. For ease of explanation, the present invention will be described in detail as applied to this exemplary application. However, this is not to be construed as a limitation of the present invention.

In order to appreciate the advantages of the present invention, it will be beneficial to describe the invention in the context of an exemplary bi-directional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

Figure 1:
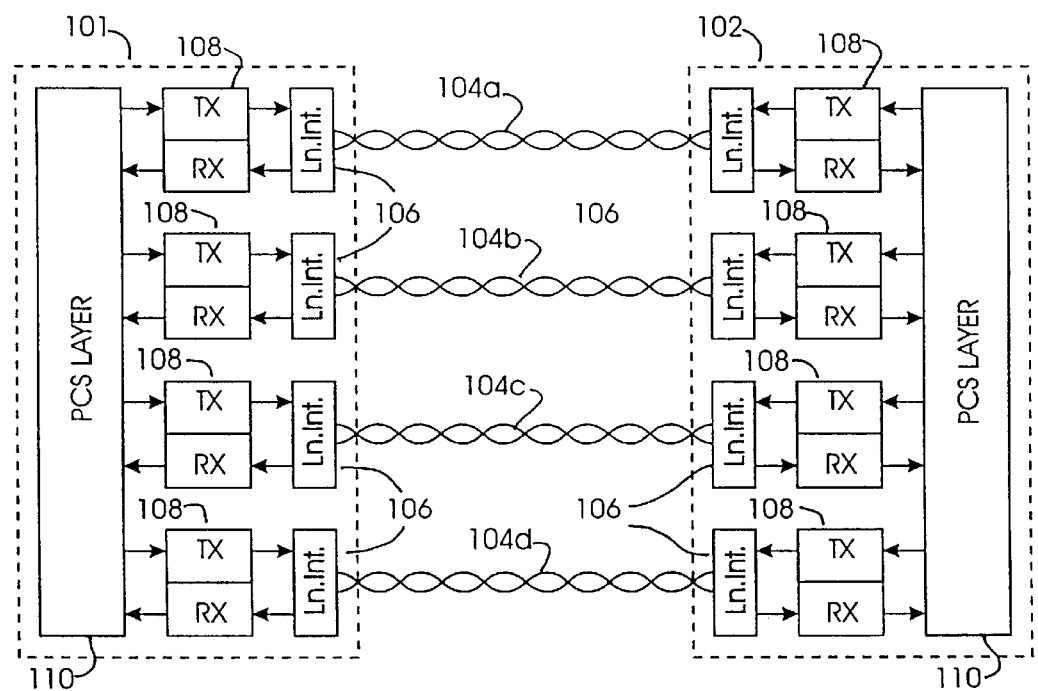
FIG. 1 is a simplified block diagram of a gigabit Ethernet communication system.

In FIG. 1, the communication system is represented as a point-to-point system in order to simplify the explanation, and includes two main transceiver blocks 101 and 102, coupled together via four twisted-pair cables 104a, b, c and d. Each of the wire pairs 104a, b, c, d is coupled to each of the transceiver blocks 101, 102 through a respective one of four line interface circuits 106. Each of the wire pairs 104a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 101 and 102, the four constituent transceivers 108 are capable of operating simultaneously at 250 megabits of information data per second (Mb/s) each, and are coupled to the corresponding remote constituent transceivers through respective line interface circuits to facilitate full-duplex bi-directional operation. Thus, 1 Gb/s communication throughput of each of the transceiver blocks 101 and 102 is achieved by using four 250 Mb/s (125 Mbaud at 2 information data bits per symbol) constituent transceivers 108 for each of the transceiver blocks 101, 102 and four pairs of twisted copper cables to connect the two transceiver blocks 101, 102 together.

The exemplary communication system of FIG. 1 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

Figure 2:
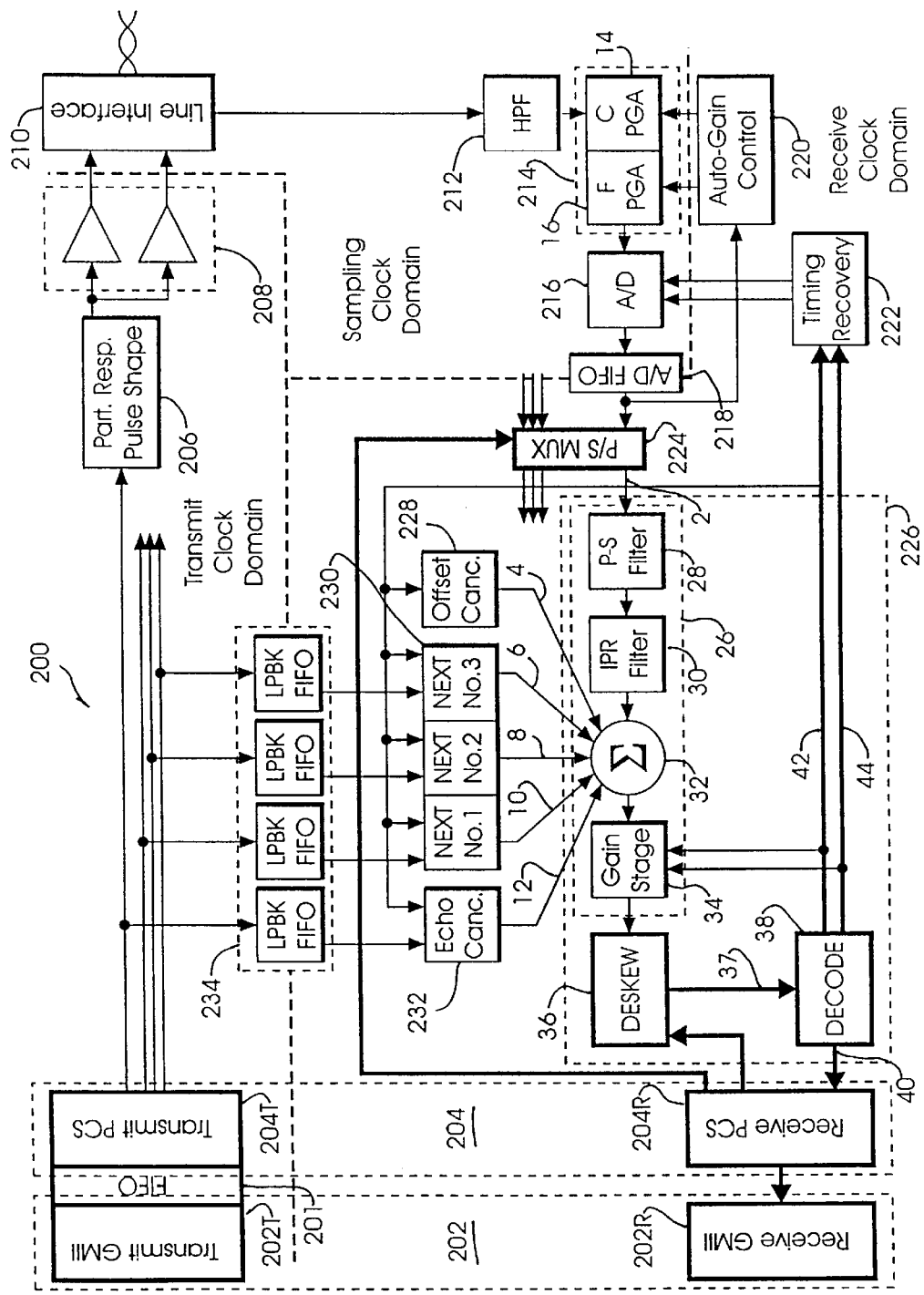
FIG. 2 is a simplified block diagram of an exemplary gigabit transceiver for use in the system of FIG. 1.

FIG. 2 is a simplified block diagram of the functional architecture and internal construction of an exemplary transceiver block, indicated generally at 200, such as transceiver 101 of FIG. 1. Since the illustrative transceiver application relates to gigabit Ethernet transmission, the transceiver will be referred to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the elasticity requirement which is a function of frame size and frequency offset.

The PCS transmit section 204T performs certain scrambling operations and, in particular, is responsible for encoding digital data into the requisite codeword representations appropriate for transmission. In, the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/ID converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

In the gigabit transceiver described above (FIG. 2), the nonlinear distortion of each transmitter mainly come from the D/A block 208 and the line interface 210. However, through its action on the D/A block 208, the partial response pulse shaping filter 206 may indirectly contribute some distortion.

The present invention can be used to determine the nonlinear distortion introduced by the transmitter portion of each constituent transceiver in the gigabit transceiver.

Figure 3:
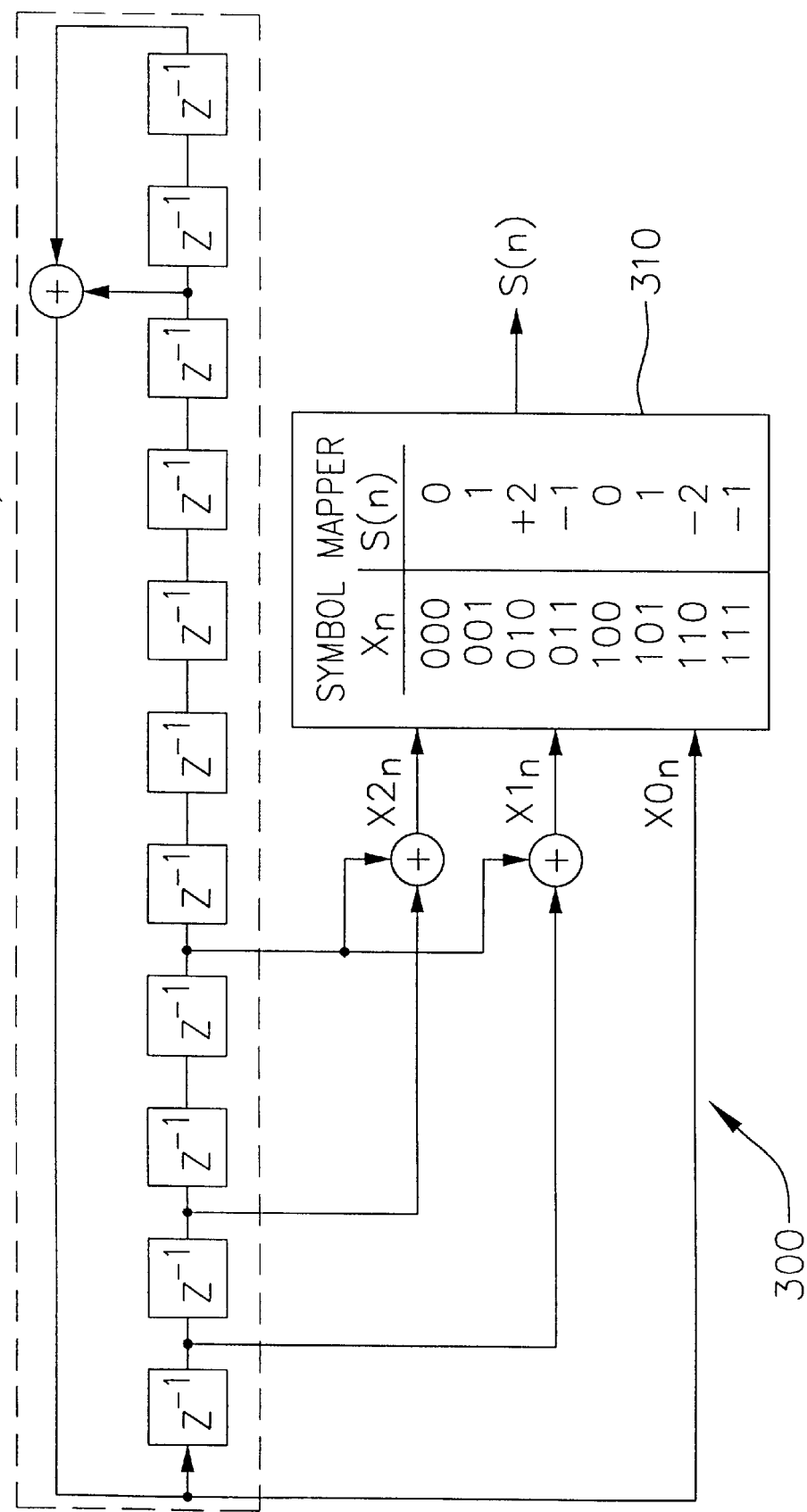
FIG. 3 is a block diagram of a symbol generator suitable for use in the present invention.

FIG. 3 is a block diagram of a symbol generator suitable for use in the present invention. The symbol generator 300 is used to generate a test symbol pattern to be transmitted by the transmitter under test. The test symbol pattern is a sequence of symbols which has statistical properties that allow determination of the amount of nonlinear distortion present in the output of a transmitter under test.

The symbol generator 300 includes a linear feedback shift register 302 and a symbol mapper 310. The linear feedback shift register 302, which includes eleven delay elements, is used to implement the generator polynomial:

$$g(s)=1+x^9+x^{11} \text{ in GF(2)}$$

where GF(2) denotes the Galois field of 2. The generator polynomial generates outputs in the binary field. The use of a linear feedback shift register to implement a generator polynomial is well known in this art. The linear feedback shift register 302 outputs a pseudo-random bit sequence $x0_n$ generated according to g(x), with the subscript n denoting the time index. The shift register 302 is updated once per symbol period. At each symbol period, the shift register is advanced by one bit and one new bit of the sequence $x0_n$ is generated. Two additional pseudo-random bit sequences $x1_n$ and $x2_n$ are generated by the linear combinations of time delayed versions of $x0_n$ as follows:

$$x1_n = x0_{n-1} \oplus x0_{n-4}$$

$$x2_n = x0_{n-2} \oplus x0_{n-4}$$

where $\oplus$ denotes the logical Exclusive OR operation. The three bit sequences $x0_n$, $x1_n$ and $x2_n$ are mutually uncorrelated over a time period greater than the length of the impulse response of the transmitter under test, which is the transmitter of a constituent transceiver 108 of a gigabit transceiver 102 (FIG. 1). The three bit sequences $x0_n$, $x1_n$ and $x2_n$ are combined into a 3-bit sequence $x_n$ which is used as an input to the symbol mapper 310 to generate the test symbol sequence S(n). The 3-bit sequence $x_n$ is generated repeatedly to allow the nonlinear distortion of the transmitter under test to be measured.

Figure 4:
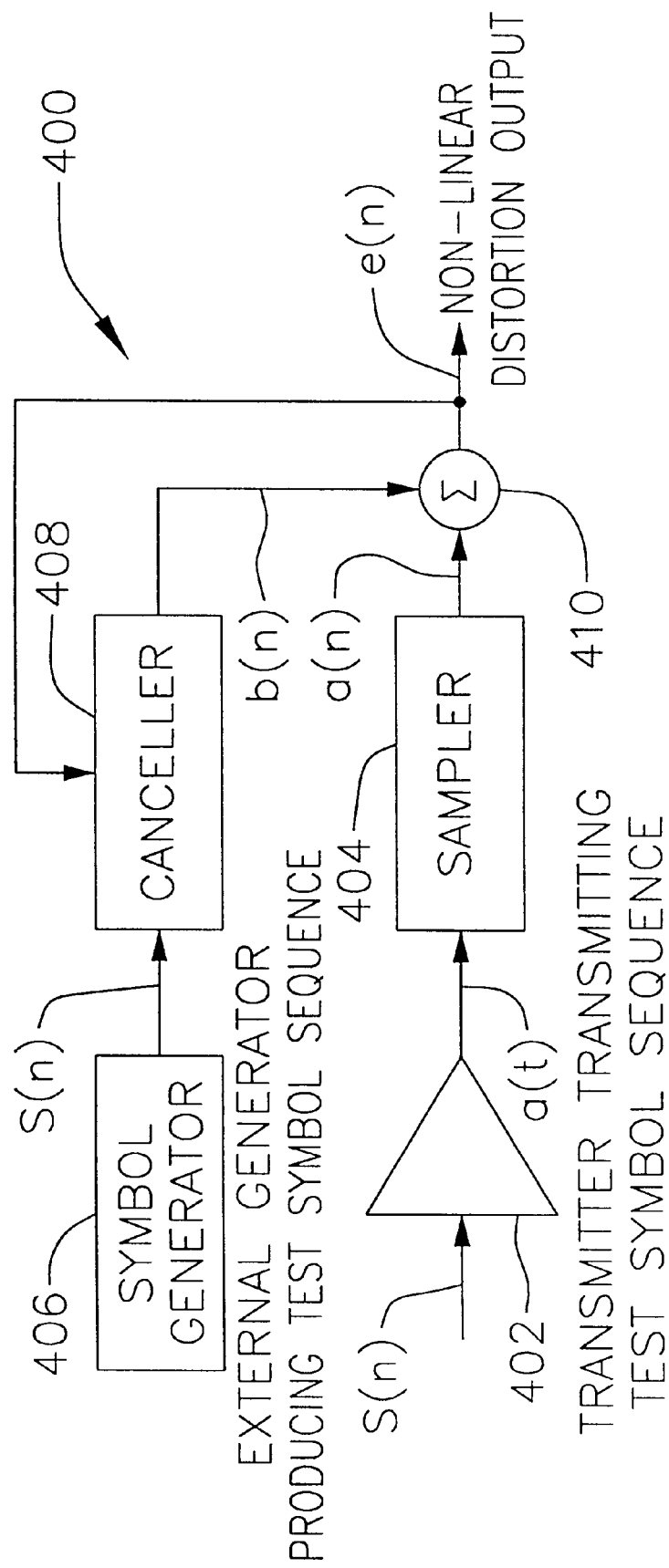
FIG. 4 is a block diagram of a system for determining transmitter distortion, constructed according to the present invention.

FIG. 4 is a block diagram of a system constructed according to the present invention. The system 400 includes the transmitter 402, which is under test, a sampler 404, an external symbol generator 406 identical to the one shown in FIG. 3, a canceller 408 and an adder 410.

The test symbol sequence $S_n$ is sent repeatedly to the transmitter 402. It is noted that the combination of the D/A converter 208 and the line interface 210 of FIG. 2 would be an example of the transmitter 402. The transmitter 402 transmits repeatedly the test symbol sequence S(n) as an analog output signal a(t). The sampler 404, i.e., a A/D converter, samples the analog output signal a(t) at an appropriate rate and resolution to produce the sampled signal a(n). The sampled signal a(n) represents the test symbol sequence S(n) as distorted by both the linear and nonlinear distortion characteristics of the transmitter 402.

The external symbol generator 406 produces the same test symbol sequence S(n) as the one being transmitted by the transmitter 402. The test symbol sequence S(n) is inputted to a canceller 408 which is an adaptive filter. In one embodiment, the canceller 408 is a finite impulse response filter and the adaptation algorithm used to adapt the filter coefficients is a least mean squares (LMS) algorithm. The LMS algorithm is well known in the art. The canceller 408 outputs a sequence b(n) and uses a feedback signal to adapt its transfer function, in other words, to adapt its coefficients. The sequence b(n) is subtracted from the sequence a(n) via the adder 410 to produce an error sequence e(n). The error sequence e(n) is used as the feedback signal to adapt the coefficients of the canceller 408. The coefficients of the canceller 408 are adapted so that the mean squared value of e(n) is minimized.

The canceller 408 correlates the test symbol sequence S(n) with the error sequence e(n) and adapts its coefficients such that the canceller output sequence b(n) reflects this correlation. Since only the linear distortion component in the error sequence e(n) correlates with the test symbol sequence S(n), the canceller output sequence b(n) represents the test symbol sequence S(n) as distorted by only the linear distortion of the transmitter 402. Therefore, when the transfer function of the canceller 408 is fully adapted, i.e., when the canceller coefficients converge, the linear distortion component is removed from the error sequence e(n), and e(n) becomes a measure of the nonlinear distortion of the transmitter 402. A peak magnitude value of e(n) is a measurement of the peak distortion of the transmitter 402 under test.

Figure 5:
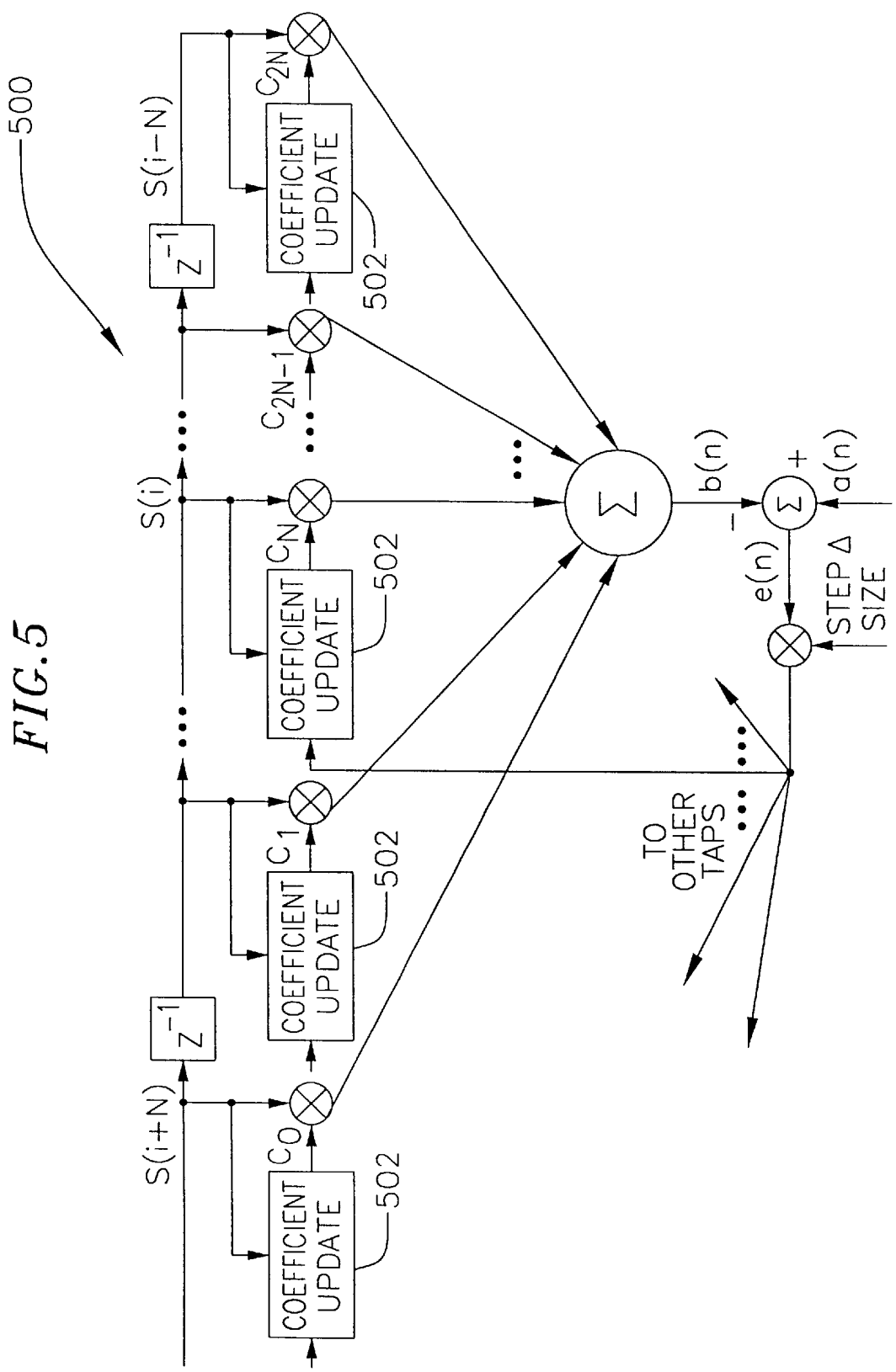
FIG. 5 illustrates an exemplary embodiment of the canceller 408 of FIG. 4.

FIG. 5 illustrates an exemplary embodiment 500 of the canceller 408 of FIG. 4. In this exemplary embodiment, the canceller has 2N+1 coefficients denoted by $C_0$ through $C_{2N}$, and a delay line having 2N delay elements denoted conventionally by $z^{-1}$. The canceller 500 includes an adaptation module 502 to train (i.e., adapt) the filter coefficients.

The well-known least mean squares algorithm is used in the training process of the filter coefficients. Referring to FIG. 5 and letting e(k) be the k-th sample of the sequence e(n), the filter coefficients are updated as follows:

$$C_{N+j}^{(k+1)} = C_{N+j}^{(k)} + \Delta \cdot e(k) \cdot S(i-j) \text{ for } j=-N, \ldots, -1, 0, 1, \ldots, N$$

where $C_{N+j}^{(k)}$ is the filter coefficient value after the (k−1)th training, and $\Delta$ is the step size of the LMS algorithm. After training, when the coefficients converge, the final value of a coefficient is $C_{N+j}$, for j=−N, . . . , N.

Figure 6:
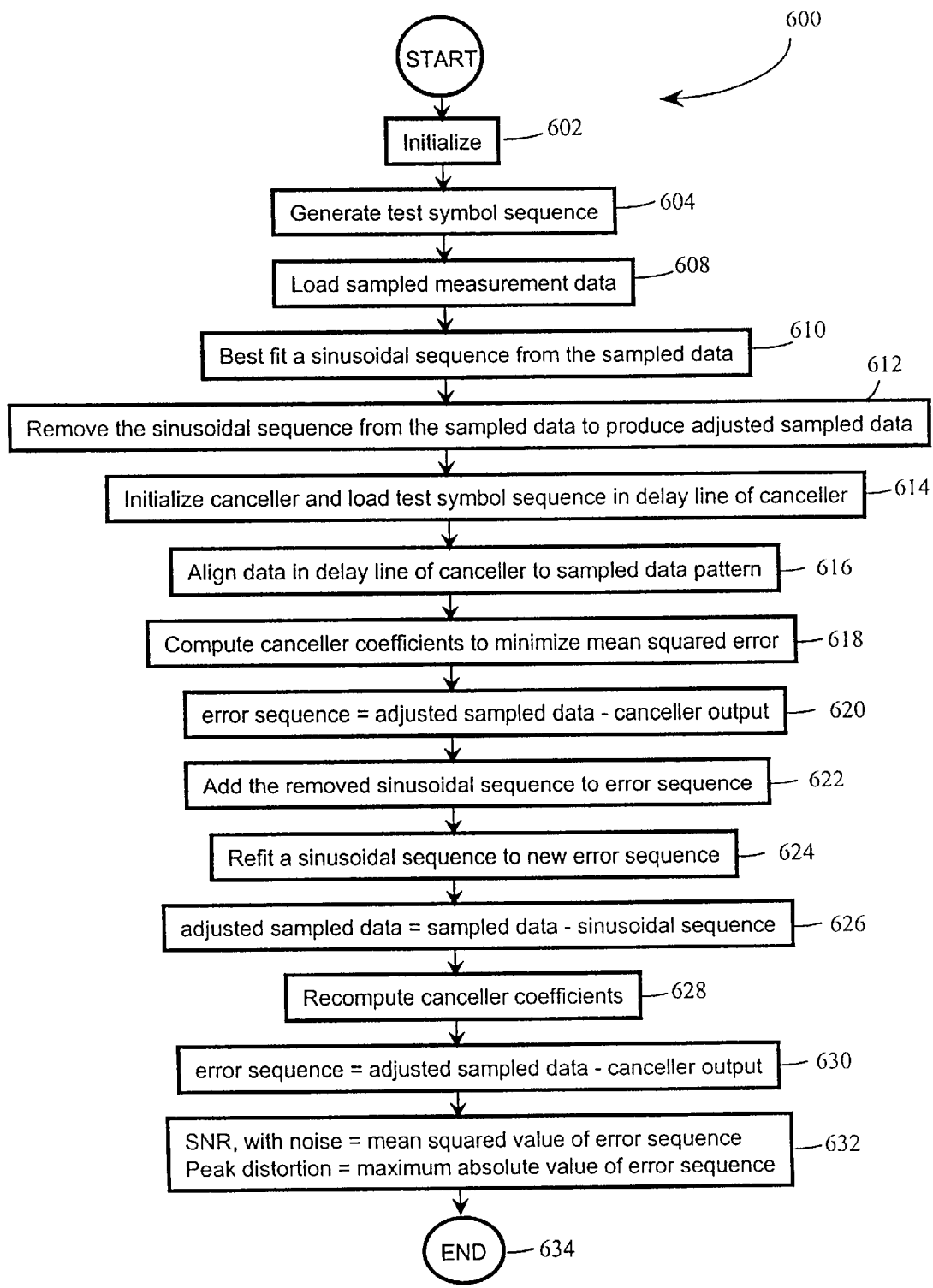
FIG. 6 is a flowchart of another embodiment of the present invention.

FIG. 6 is a flowchart of another embodiment of the present invention. In this embodiment 600, the processing of the transmitted data are done off-line, i.e., after all the sampled data are collected from the sampler 404 (FIG. 4).

Process 600 provides a simple technique to determine the distortion of a transmitter such as the one included in each constituent transceiver of the gigabit transceiver (FIGS. 1 and 2). Process 600 allows measurement of the transmitter distortion in the presence of a disturbing signal sent from a remote transmitter.

Upon Start, process 600 initializes all variables (block 602). Process 600 generates the test symbol sequence (block 604). In one example, the test symbol sequence has 2047 symbols. Process 600 loads the sampled measurement data (block 608). Process 600 fits a sinusoidal sequence to the sampled measurement data (block 610) using a best fit algorithm then subtracts the sinusoidal sequence from the sampled measurement data to produce the adjusted sampled data (block 612). Process 600 initializes the canceller and inputs the test symbol sequence into the delay line of the canceller (block 614). Process 600 aligns the data in the delay line of canceller to the adjusted sampled data pattern (block 616). Process 600 computes the canceller coefficients that minimize the mean squared error between the output of the canceller and the adjusted sampled data (block 618). An exemplary algorithm that can be used for this computation of canceller coefficients is the well known minimum mean squares algorithm. Process 600 then computes the error sequence as the difference between the adjusted sampled data and the output of the canceller (block 620). At this point, process 600 can go directly to block 632 to compute the peak distortion of the transmitter.

The blocks 622 through 630 are optional. They are used to ensure that any residual of the sinusoidal sequence in the error sequence is removed. The fitting of the sinusoidal sequence to the sampled measurement data may not be completely correct because of the presence of the test symbol sequence and the linear distortion in the sampled measurement data that is not yet removed by the canceller. Thus, there may be residual of the sinusoidal sequence in the error sequence. Thus, in this case, the error sequence may not be a true measure of the nonlinear distortion.

The blocks 622 through 630 are also used to ensure that any effect of the sinusoidal sequence on the canceller output is removed. In principle, the canceller function does not get affected by the presence of the sinusoidal sequence in the feedback sequence e(n) (FIG. 4) for the following reason. Since the canceller correlates its input sequence, i.e., the test symbol sequence, with the feedback sequence e(n), and since the sinusoidal sequence does not correlate with the input sequence, the output of the canceller should be unaffected by the sinusoidal sequence and should be the same as for the case where there is no sinusoidal sequence included in e(n). However, in practice, the sinusoidal sequence in e(n) may have some effect on the output of the canceller due to the finite length of the test symbol sequence.

In block 622, process 600 adds the previously removed sinusoidal sequence to the error sequence. Process 600 refits a sinusoidal sequence to the resulting error sequence (block 624). Since most of the non-sinusoidal part of the sampled measurement data has been removed from the resulting error sequence at this point, the fitting of a sinusoidal sequence to the resulting error sequence now yields a near perfect fit. Process 600 then subtracts the new sinusoidal sequence from the sampled measurement data to produce new adjusted sampled data (block 626). Process 600 recomputes the canceller coefficients so as to minimize the mean squared error between the output of the canceller and the new adjusted sampled data (block 628). Process 600 recomputes the error sequence as the difference between the new adjusted sampled data and the output of the canceller (block 630). Process 600 computes the signal to noise ratio using a fixed known value as the signal value and the mean squared value of the error sequence as the noise value, and computes the peak distortion of the transmitter as the maximum absolute value of the error sequence (block 632). Process 600 then terminates (block 634).

Figure 7:
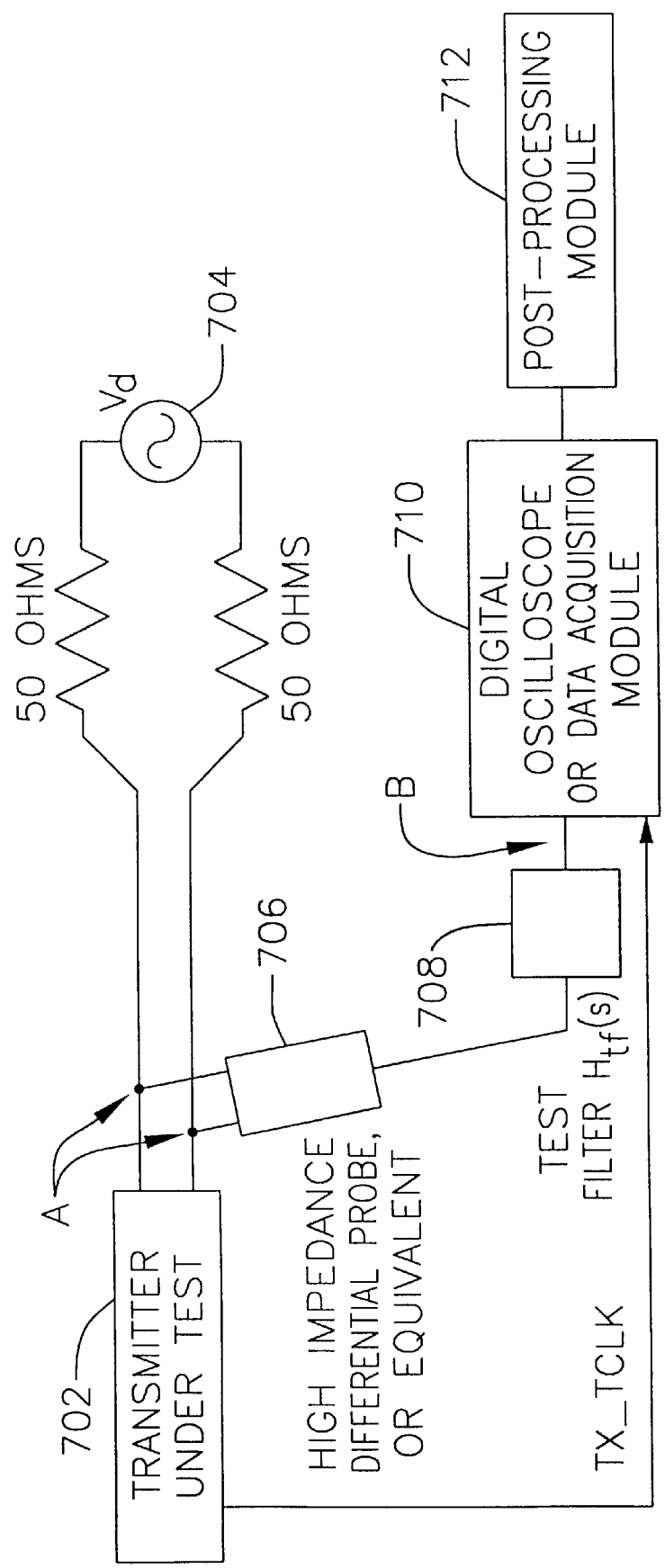
FIG. 7 illustrates a transmitter test fixture for distortion measurement, where Process 600 of FIG. 6 can be used as the post-processing module.

FIG. 7 illustrates a transmitter test fixture for distortion measurement. Process 600 can be used as the post-processing module in this test fixture. The transmitter under test 702 is coupled to a sinewave generator 704. This is to simulate the real situation where the local transceiver would be connected in full duplex communication to a remote transceiver. In such a case, the signal sent by the remote transmitter would be a 2.8 volts peak-to-peak sinusoidal signal and would be a disturbing signal to the local transmitter, causing stress to its analog components which in turn produce more nonlinear distortion. The transmitted signal is measured by a high impedance differential probe 706 (or any equivalent device). The measured signal is filtered by a test filter 708. The test filter 708 may be located between points A and B. The test filter 708 is used to ensure that the impulse response of the transmitter is limited within the length of the canceller used by the post-processing module 712. The filtered signal is sent to a data acquisition module 710 to be sampled. The sampling rate is provided by the clock signal TX_TCLK which is also the clock signal that controls the transmission rate of the transmitter 702. The sampled data are inputted to the post-processing module 712. Process 600 (FIG. 6) can be used as the post-processing module 712.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A symbol generator for generating a test symbol sequence S(n) for measuring nonlinear distortion of a transmitter under test, characterized by:

a shift register for generating a set of bit sequences; and a symbol mapper for mapping the bit sequences to the test symbol sequence;

wherein the shift register is further characterized by:

a linear feedback shift register having eleven delay elements to implement the generator polynomial: $g(s)=1+x^9+x^{11}$ in GF(2), wherein GF(2) denotes the Galois field of 2, the generator polynomial outputting a pseudo-random bit sequence $x0_n$ generated according to g(x), with subscript n denoting a time index, the linear feedback shift register being updated once per symbol period and at each symbol period the linear feedback shift register being advanced by one bit and one new bit of sequence $x0_n$ being generated, the linear feedback register providing two additional pseudo-random bit sequences $x1_n$ and $x2_n$ being generated by the linear combinations of time delayed versions of $x0_n$, wherein:

$$x1_n = x0_{n-1} \oplus x0_{n-4}$$

$$x2_n = x0_{n-2} \oplus x0_{n-4}$$

and wherein $\oplus$ denotes a logical exclusive OR operation, the three bit sequences $x0_n$, $x1_n$ and $x2_n$ being mutually uncorrelated over a time period greater than the length of an impulse response of a transmitter under test, the three bit sequences $x0_n$, $x1_n$ and $x2_n$ being combined into a 3-bit sequence $x_n$ which is used as an input to the symbol mapper to generate the test symbol sequence S(n), the 3-bit sequence $x_n$ being generated repeatedly.

2. A system for determining nonlinear distortion of a transmitter, the system characterized by:

(a) the transmitter transmitting a test symbol sequence S(n), generated for measuring nonlinear distortion of a transmitter under test, as an analog output signal;

(b) a sampler sampling the analog output signal to produce a first sequence, the first sequence representing a combination of the test symbol sequence, a linear distortion sequence and a nonlinear distortion sequence;

(c) an adaptive filter filtering at least a portion of the nonlinear distortion sequence from the first sequence to produce a second sequence;

(d) an adder combining the first sequence and the second sequence; and (e) wherein the transmitter is further characterized by a symbol generator for generating the test symbol sequence, wherein the symbol generator is further characterized by:

a symbol mapper for mapping the bit sequences to the test symbol sequence; and a shift register for generating a set of bit sequences, wherein the shift register is further characterized by:

a linear feedback shift register having eleven delay elements to implement the generator polynomial: $g(s) = 1 + x^9 + x^{11}$ in GF(2), wherein GF(2) denotes the Galois field of 2, the generator polynomial outputting a pseudo-random bit sequence $x0_n$ generated according to g(x), with subscript n denoting a time index;

the linear feedback shift register being updated once per symbol period and at each symbol period the linear feedback shift register being advanced by one bit and one new bit of sequence $x0_n$ being generated;

the linear feedback register providing two additional pseudo-random bit sequences $x1_n$ and $x2_n$ being generated by the linear combinations of time delayed versions of $x0_n$, wherein:

$$x1_n = x0_{n-1} \oplus x0_{n-4}$$

$$x2_n = x0_{n-2} \oplus x0_{n-4}$$

and wherein $\oplus$ denotes a logical exclusive OR operation, the three bit sequences $x0_n$, $x1_n$ and $x2_n$ being mutually uncorrelated over a time period greater than the length of an impulse response of a transmitter under test, the three bit sequences $x0_n$, $x1_n$ and $x2_n$ being combined into a 3-bit sequence $x_n$ which is used as an input to the symbol mapper to generate the test symbol sequence S(n), the 3-bit sequence $x_n$ being generated repeatedly.

* * * * *

UNITED STATES PATENT AND TRADEMARK OFFICE
CERTIFICATE OF CORRECTION

PATENT NO. : 6,731,914 B2
DATED : May 4, 2004
INVENTOR(S) : Creigh et al.

It is certified that error appears in the above-identified patent and that said Letters Patent is hereby corrected as shown below:

Title page,
Item [60], Related U.S. Application Data, insert -- PCT application No. PCT/US99/25811, filed on Nov. 2, 1999, -- before the text which reads "Provisional application No. 60/130,616, filed on Apr. 22, 1999, provisional application No. 60/108,319, filed on Nov. 13, 1998, and provisional application No. 60/106,870, filed on Nov. 2, 1998".

Column 1,
Line 7, replace "invention" with -- application is a continuation of PCT application No. PCT/US99/25811, which --.

Signed and Sealed this

Thirty-first Day of August, 2004

JON W. DUDAS
*Director of the United States Patent and Trademark Office*